(12) United States Patent
Hirose

(10) Patent No.: US 6,249,013 B1
(45) Date of Patent: Jun. 19, 2001

(54) MICROWAVE-MILLIMETER WAVE CIRCUIT DEVICE AND METHOD FOR MANUFACTURING THE SAME

(75) Inventor: Tatsuya Hirose, Kawasaki (JP)

(73) Assignee: Fujitsu Limited, Kawasaki (JP)

(*) Notice: Subject to any disclaimer, the term of this patent is extended or adjusted under 35 U.S.C. 154(b) by 0 days.

(21) Appl. No.: 09/221,167

(22) Filed: Dec. 28, 1998

(30) Foreign Application Priority Data

Mar. 20, 1998 (JP) .................................................. 10-072516

(51) Int. Cl.$^7$ .................................................. H01L 27/10
(52) U.S. Cl. .................. 257/208; 257/209; 257/211; 257/347; 257/664; 257/734; 257/775
(58) Field of Search .................................. 257/208, 209, 257/211, 347, 664, 734, 775; 438/13, 17; 333/205, 246

(56) References Cited

U.S. PATENT DOCUMENTS 4,619,001 * 10/1986 Kane ...................................... 455/192
5,343,176 * 8/1994 Hasler .................................. 333/204
5,654,676 * 8/1997 Avanic et al. .......................... 331/67

* cited by examiner

*Primary Examiner*—Sara Crane
(74) *Attorney, Agent, or Firm*—Armstrong, Westerman, Hattori, McLeland & Naughton

(57) ABSTRACT

A microwave-millimeter wave circuit device with a coplanar wiring includes a dielectric substrate having a dielectric region, a ground conductor connecting wiring and circuit elements formed on the dielectric substrate, a wiring electrically connected to the circuit elements and crossing over a part of the ground conductor connecting wiring on the dielectric substrate, and ground conductor patterns separated from each other by the wiring, being electrically connected to each other via part of the ground conductor connecting wiring, and forming the coplanar wiring on the dielectric substrate, together with the wiring. At least one end of that part of the ground conductor connecting wiring via which the ground conductor patterns are electrically connected to each other is provided with an extended portion which is at least 10 μm long, in order to permit the coplanar wiring to be redesigned in compensation for variations in characteristics of the circuit elements so that the cost of manufacturing the microwave-millimeter wave circuit device with the coplanar wiring can be reduced.

20 Claims, 13 Drawing Sheets

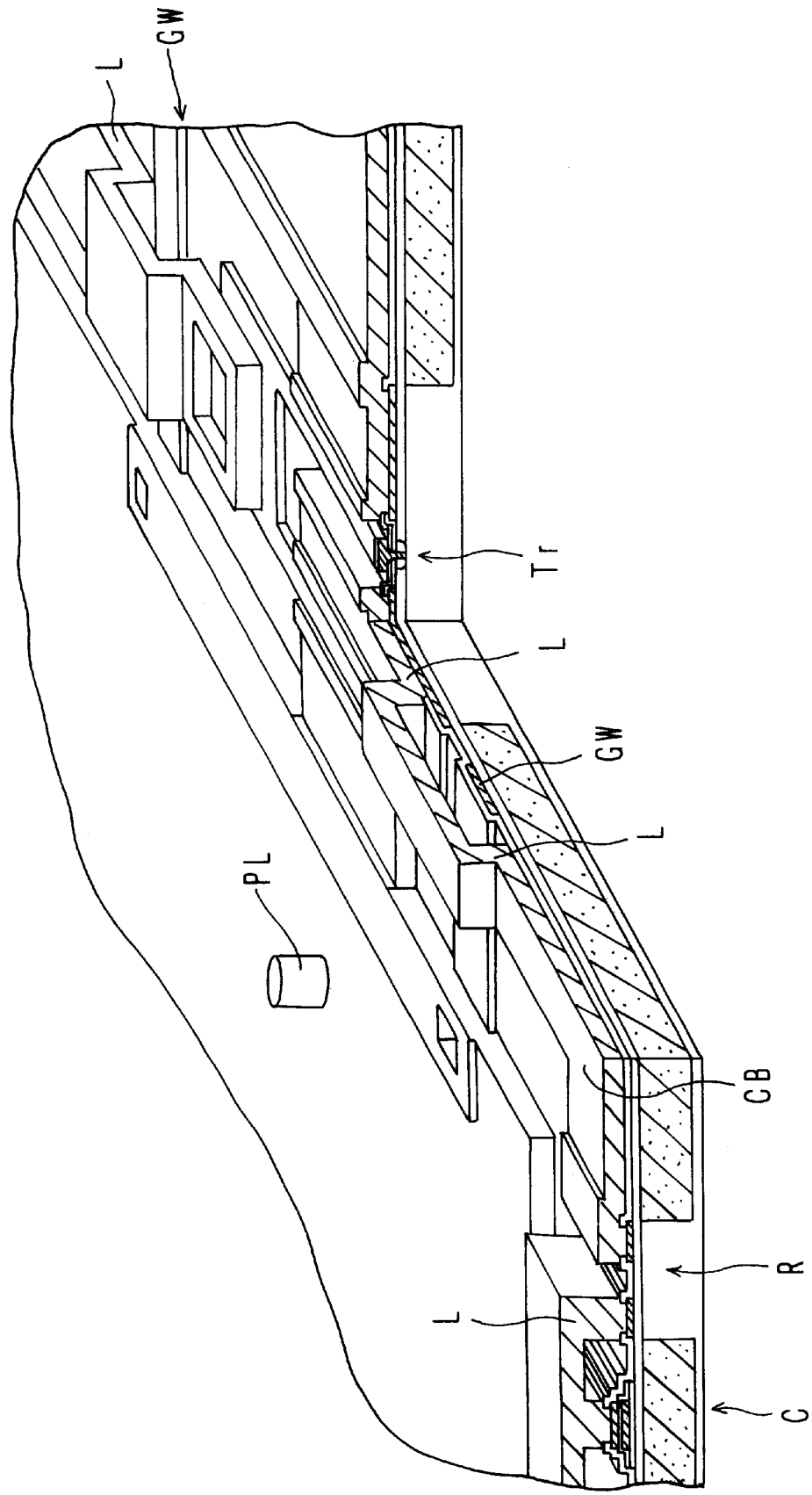

MICROWAVE-MILLIMETER WAVE CIRCUIT DEVICE AND METHOD FOR MANUFACTURING THE SAME

This application is based on Japanese patent application Hei 10-72516 filed on Mar. 20, 1998, the entire contents of which are incorporated herein by reference.

BACKGROUND OF THE INVENTION a) Field of the Invention

The present invention relates to a microwave-millimeter wave circuit device and a method for manufacturing the same, and more particularly to a microwave-millimeter wave circuit device having a coplanar wiring and a method for manufacturing the circuit device.

b) Description of the Related Art

A monolithic microwave-millimeter wave integrated circuit device (MMIC) is known as a semiconductor IC device used in a high frequency band associated with microwaves, millimeter waves, etc. The use of a high frequency is required for transmission, reception and the like. In signal processing, however, operations at such a high frequency are not required. In view of this, the method of forming circuits which operate at a particularly high frequency on IC chips and bonding the IC chips onto a circuit board is adopted. In most cases, an MMIC is formed as such an IC chip.

The mobility of charge carriers in a semiconductor is restricted by the material of the semiconductor. Generally speaking, the mobility of carriers in a compound semiconductor like GaAs and InP is higher than that of carriers in Si. The compound semiconductor, therefore, is more suitable than Si in forming a high frequency IC.

A semiconductor element whose parasitic capacitance is small is preferred as one which operates in a high frequency band. In the case of the compound semiconductor, since a semi-insulating region can be formed therein by Cr doping, oxygen ion implantation, etc., a semiconductor element employing dielectric isolation, not pn isolation, can be provided. By adopting the chemical compound and conducting the dielectric isolation, a semiconductor device whose attendant capacitance is considerably small can be realized.

A 77 GHz radar, for example, is available as a millimeter wave circuit device. When forming the entirety of the radar on the compound semiconductor, a compound semiconductor substrate having a large area is required, because its transmission/reception antenna occupies a large area. This results in the cost of the entire device being extremely high. In order to reduce the manufacturing cost, it is preferable to form an antenna on a dielectric substrate made of an inexpensive material and to form only a circuit section, which needs to operate at a high frequency, as an MMIC made of the compound semiconductor, and to bond the MMIC onto the substrate on which the antenna has been formed.

In general, the compound semiconductor substrate has a dielectric constant of 10 or greater. Signals, transmitted through a wiring formed on the substrate with such a high dielectric constant, have a short wavelength. In the case of a frequency of 77 GHz, signals transmitted through coplanar lines, for example, have a wavelength of approximately 1.6 mm.

The geometric dimensions of a semiconductor active element formed on the compound semiconductor substrate tend to decrease as its performance is improved. A minor variation in the shape of the semiconductor element results in a considerable variation in the input/output impedance of the semiconductor active element.

When the input/output impedance of the semiconductor active element as formed differs from the design value, the dimensions of a peripheral circuit element, in particular, a matching circuit, need to be changed. Any design change will be possible if a semiconductor IC device is remanufactured from the beginning. However, the semiconductor substrate on which the semiconductor element, etc. have been formed has to be abandoned. This makes the manufacturing cost high.

In the case of a coplanar wiring, a ground conductor and a signal wiring are arranged in the same plane. The signal wiring separates the ground conductor into parts. Under this condition, it is difficult to keep the potential of the ground conductor uniform. The potential of the ground conductor is unstable especially when the ground conductor has such a width and a length that the conductor itself has impedance.

SUMMARY OF THE INVENTION

It is accordingly an object of the present invention to provide a microwave-millimeter wave circuit device having a coplanar wiring, capable of performing a stable operation while reducing the manufacturing cost.

It is another object of the present invention to provide a method for manufacturing such a microwave-millimeter wave circuit device having a coplanar wiring.

According to one aspect of the present invention, there is provided a microwave-millimeter wave circuit device comprising: a dielectric substrate having a dielectric region; a ground conductor connecting wiring and circuit elements which are formed on the dielectric substrate; a wiring electrically connected to the circuit elements and crossing over a part of the ground conductor connecting wiring on the dielectric substrate; and ground conductor patterns separated from each other by the wiring, being electrically connected to each other via a part of the ground conductor connecting wiring, and forming a coplanar wiring on the dielectric substrate, together with the wiring. At least one end of that part of the ground conductor connecting wiring via which the ground conductor patterns are electrically connected to each other is provided with an extended portion which is at least 10 $\mu$m long, in order to permit the coplanar wiring to be redesigned in compensation for variations in characteristics of the circuit elements.

By electrically connecting the ground conductor patterns to each other via the ground conductor connecting wiring, the potentials of the ground conductor patterns can be stabilized. The ground conductor connecting wiring has extra parts in addition to the required parts. The ground conductor patterns are connected to each other via the aforementioned required parts. When an unintended variation occurs in a circuit parameter, the wiring and the ground conductor patterns once formed are removed, and a new wiring and new ground conductor patterns are formed, thus redesigning the circuit device. The aforementioned extra parts have been formed long enough to electrically connect the new ground conductor patterns to each other. By virtue of the presence of the extra parts, the circuits elements once formed on the dielectric substrate, such as semiconductor elements and capacitor elements, etc. can be reused.

As described above, the ground conductor connecting wiring is formed in advance so as to be longer than required. Due to this, when any design change becomes necessary after the formation of the coplanar wiring, the coplanar wiring can be removed and a new coplanar wiring can be formed in a position different from that previously formed. Since the circuit elements formed on the substrate in advance can be reused, the manufacturing cost can be reduced.

BRIEF DESCRIPTION OF THE DRAWINGS

FIG. 8 is an enlarged perspective view of a part of the MMIC according to the above embodiment of the present invention;

DETAILED DESCRIPTION OF THE PREFERRED EMBODIMENTS

Embodiments of the present invention will now be described in detail, with reference to the accompanying drawings.

Figure 3:
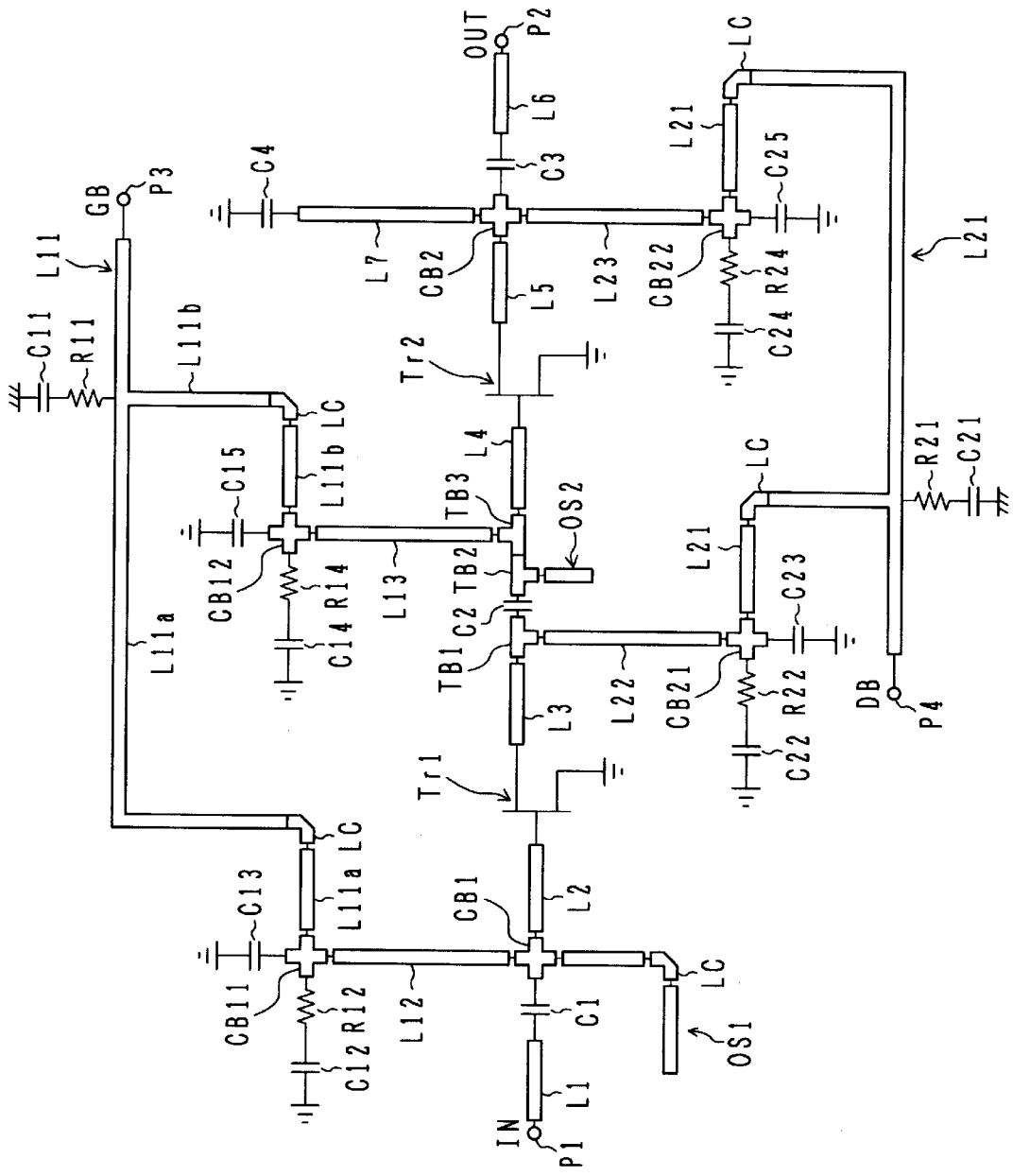
FIG. 3 is an illustration of an equivalent circuit of the circuit shown in FIG. 1.

FIG. 3 is the illustration of the equivalent circuit of an MMIC manufactured according to one embodiment of the present invention. An input pad P1 shown in the left part of the illustration receives an input signal IN, and is connected to one electrode of a capacitor C1 via a line L1. The other electrode of the capacitor C1 is connected to the gate electrode of a transistor Tr1 via a cross-shaped branch CB1 and a line L2. The transistor Tr1 is constituted by a high electron mobility transistor (HEMT), for example.

The source electrode of the transistor Tr1 is connected to the ground, while the drain electrode thereof is connected to one electrode of a capacitor C2 via a line L3 and a T-shaped branch TB1. The other electrode of the capacitor C2 is connected to the gate electrode of a transistor Tr2 via T-shaped branches TB2 an d TB3 and a line L4. The transistor Tr2 is constituted by an HEMT, for example.

The source electrode of the transistor Tr2 is connected to the ground, while the drain electrode thereof is connected to one electrode of a capacitor C3 via a line L5 and a cross-shaped branch CB2. The other electrode of the capacitor C3 is connected to an output pad P2 via a line L6. A main signal wiring, through which a high frequency signal is transmitted and amplified by a two-stage amplifier, is thus formed. The capacitors C1, C2 and C3 cut off DC components.

A gate bias pad P3, shown in the upper part of the illustration, applies a DC voltage GB in order to apply the bias voltage to the gate electrodes of the transistors Tr1 and Tr2. The gate bias pad P3 is connected to a line L11, which branches into two lines, L11a and L11b. A resistor R11 and a capacitor C11 are connected in series between the branch point of the line L11 and the ground, and absorb low frequency components. A curve LC of nearly 90 degrees may be provided in the line L11.

The left-hand line L11a is connected via a cross-shaped branch CB11 and a line L12 to the cross-shaped branch CB1 provided in the main signal wiring through which the high frequency signal passes.

A capacitor C12 and a resistor R12 are connected in series between the cross-shaped branch CB11 and the ground, and a capacitor C13 is also connected between the cross-shaped branch CB11 and the ground. The capacitor C12, the resistor R12 and the capacitor C13 absorb or reduce high frequency components coming from the main signal wiring and any other high frequency components. With the above structure, the DC bias applied to the gate bias pad P3 is applied to the gate electrode of the transistor Tr1.

The right-hand line L11b is connected via a cross-shaped branch CB12 and a line L13 to the T-shaped branch TB3 provided in the main signal wiring. A resistor R14 and a capacitor C14 are connected in series between the cross-shaped branch CB12 and the ground, and a capacitor C15 is also connected between the cross-shaped branch CB12 and the ground. Those capacitors and the resistor absorb or reduce high frequency components coming from the main signal wiring and any other high frequency components.

A drain bias pad P4, shown in the lower part of the illustration, applies a DC bias DB in order to apply the DC bias voltage to the drain electrodes of the transistors Tr1 and Tr2. The drain bias pad P4 is connected via a line L21, cross-shaped branches CB21, CB22 and lines L22, L23 to the branches TB1 and CB2 provided in the main signal wiring. The branch point of the line L21 is connected to the ground via a resistor R21 and a capacitor C21 which are connected in series.

The cross-shaped branch CB21 is connected to the ground via a resistor R22 and a capacitor C22 which are connected in series, and also via a capacitor C23, in order to absorb or reduce high frequency components coming from the main signal wiring and any other high frequency components. The cross-shaped branch CB21 is connected to the T-shaped branch TB1 via the line L22, and applies a drain bias to the drain electrode of the transistor Tn through the line L3.

The cross-shaped branch CB22 is connected to the ground via a resistor R24 and a capacitor C24 which are connected in series, and also via a capacitor C25. By virtue of employing this structure, high frequency components coming from the main signal wiring and any other high frequency components are absorbed or reduced. The cross-shaped branch CB22 is connected to the cross-shaped branch CB2 via the line L23, and applies a drain bias voltage to the drain electrode of the transistor Tr2 through the line L5.

For the sake of impedance matching on the input side of the transistor Tr, an open stub OS1 is connected to the cross-shaped branch CB1. The open stub OS1 may be provided with a curve LC.

For the sake of interstage matching, an open stub OS2 is connected to the T-shaped branch TB2 between the output side of the transistor Tr1 and the input side of the transistor Tr2. A matching line L7 and a capacitor C4 for a specific-frequency short circuit are connected in series to the cross-shaped branch L5 are reflection phase adjusting wiring lines provided on the input and output sides.

In such a high frequency circuit, when the characteristics of the transistors Tr1 and Tr2 as formed differ from the design characteristics, the positions in which the open stubs OS1 and OS2 and the line L7 are connected to the main signal wiring, their lengths, etc. need to be changed.

In the case of enabling the circuit to operate at different frequencies with the same circuit structure, the constants of the lines also need to be changed.

The structure of the MMIC for realizing the high frequency circuit of FIG. 3 with such a structure as can allow the design changes, and a method for manufacturing the MMIC, will now be described.

Figure 1:
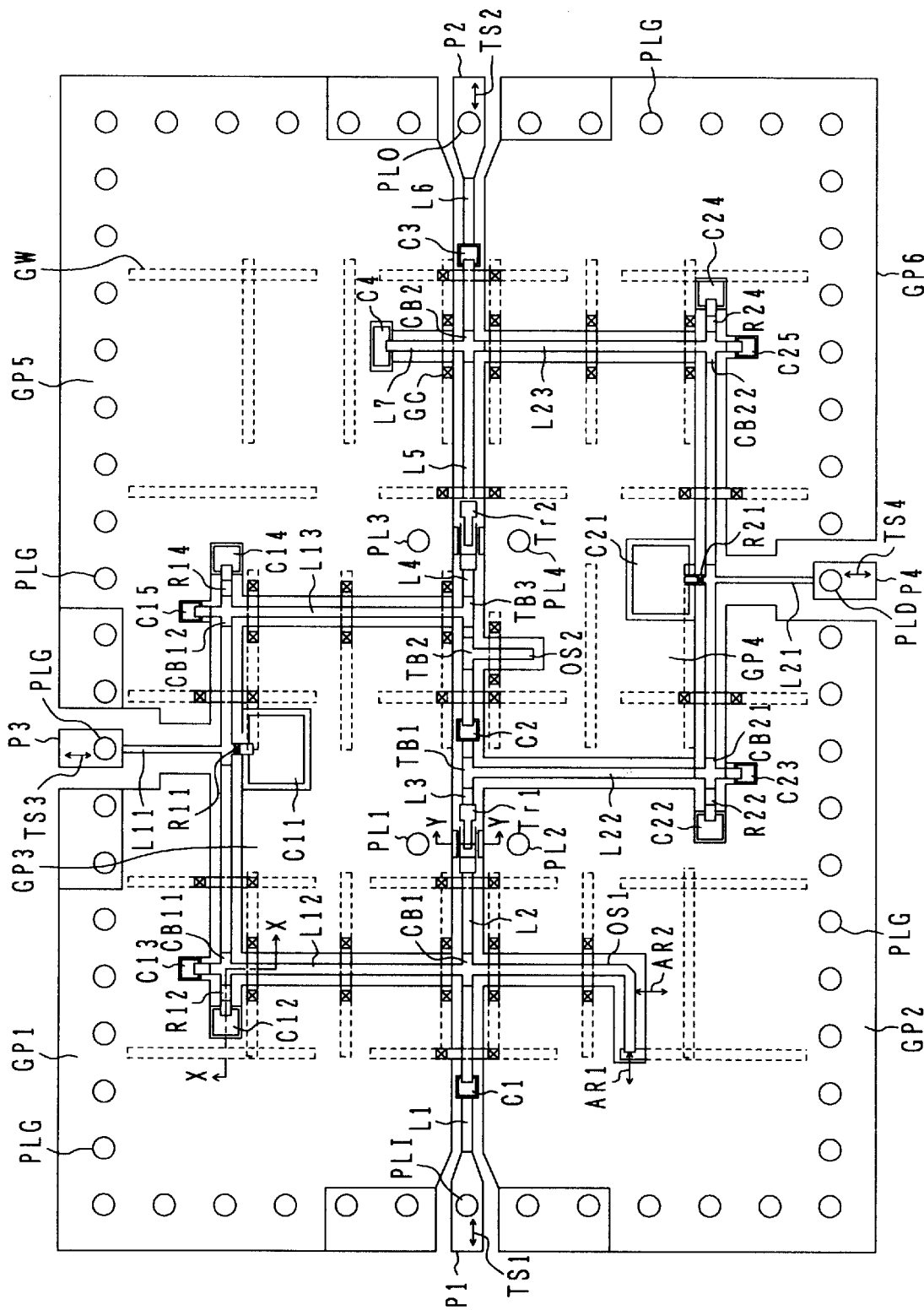
FIG. 1 is a diagram schematically illustrating a plan view of the structure of an MMIC according to one embodiment of the present invention.

FIG. 1 exemplifies in plan view the structure of a semiconductor IC device which realizes the high frequency circuit of FIG. 3 on a compound semiconductor substrate. In FIGS. 1 and 3, like reference numerals denote corresponding parts. In FIG. 1, the main signal wiring extends traversing the central part of the illustration.

The main signal wiring connects the lefthand input pad P1 and the righthand output pad P2 via the line L1, the capacitor C1, the cross-shaped branch CB1, the line L2, the transistor Tr1 consisting of an HEMT, the line L3, the T-shaped branch TB1, the capacitor C2, the T-shaped branches TB2 and TB3, the line L4, the transistor Tr2 consisting of an HEMT, the line L5, the cross-shaped branch CB2, the capacitor C3 and the line L6.

The gate bias applying pad P3 shown in the upper part of the illustration is connected to the line L11, which branches into two parts. Of those two parts, the left-handed part is connected to the cross-shaped branch CB1 of the main signal wiring via the cross-shaped branch CB11 and the line L12. The resistance R12 and the capacitor C12 are connected in series to the cross-shaped branch CB11, and also the capacitor C13 is connected to the cross-shaped branch CB11.

The resistor R11 and the capacitor C11 are connected in series to the branch point of the line l1 which is located in a position facing the pad P3, and reduce low frequency components. The right-handed part of the line L11 is connected to the T-shaped branch TB3 via the cross-shaped branch CB12 and the line L13. The resistor R14 and the capacitor C14, which are connected in series, and the capacitor C15 are connected to the cross-shaped branch CB12.

The drain bias applying pad P4 shown in the lower part of the illustration is connected to the line L21, which branches into two parts. Each of those two parts is connected to a corresponding one of the cross-shaped branches CB21 and CB22. The cross-shaped branches CB21 and CB22 are connected to the T-shaped branch TB1 and the cross-shaped branch CB2 via the lines L22 and L23, respectively.

The resistor R22 and the capacitor C22, which are connected in series, and the capacitor C23 are connected to the cross-shaped branch CB21. The resistor R24 and the capacitor C24, which are connected in series, and the capacitor C25 are connected to the cross-shaped branch CB22. The resistor R21 and the capacitor C21 are connected in series to the branch point of the line L21 which is located in a position facing the drain bias applying pad P4.

The open stub OS1 is connected to the cross-shaped branch CB1 provided in the main signal wiring, while the open stub OS2 is connected to the T-shaped branch TB2. The line L7 and the capacitor C4 are connected to the cross-shaped branch CB2.

The above-described structure realizes the equivalent circuit illustrated in FIG. 3. On both sides of the main signal wiring and both sides of a bias voltage applying line, there are six ground conductor patterns GP1, GP2, GP3, GP4, GP5 and GP6. Those ground conductor patterns are separated by the wiring.

The potentials of the ground conductor patterns separated from each other are unstable. In order to accommodate structures such as the open stubs and the series connection of a line and a capacitor, the ground conductor patterns are notched or cut-away. When a notch is long and narrow, the potentials of those parts of a ground conductor pattern layer which are located on both sides of the notch are unstable. The potentials are unstable especially when the ground conductor pattern layer has such a width and length that the layer itself has impedance.

A ground conductor connecting wiring GW is formed in order to stabilize the potentials of the individual parts of the ground conductor pattern layer. The ground conductor connecting wiring lines constituting the wiring GW are distributed over the main area of a dielectric substrate. Each ground conductor connecting wiring line connects two adjacent ground conductor patterns GP through crosshatched contacts GC. The ground conductor connecting wiring GW is formed utilizing the process of manufacturing semiconductor elements such as transistors formed in a semiconductor region and capacitors formed on a dielectric region.

Figure 2:
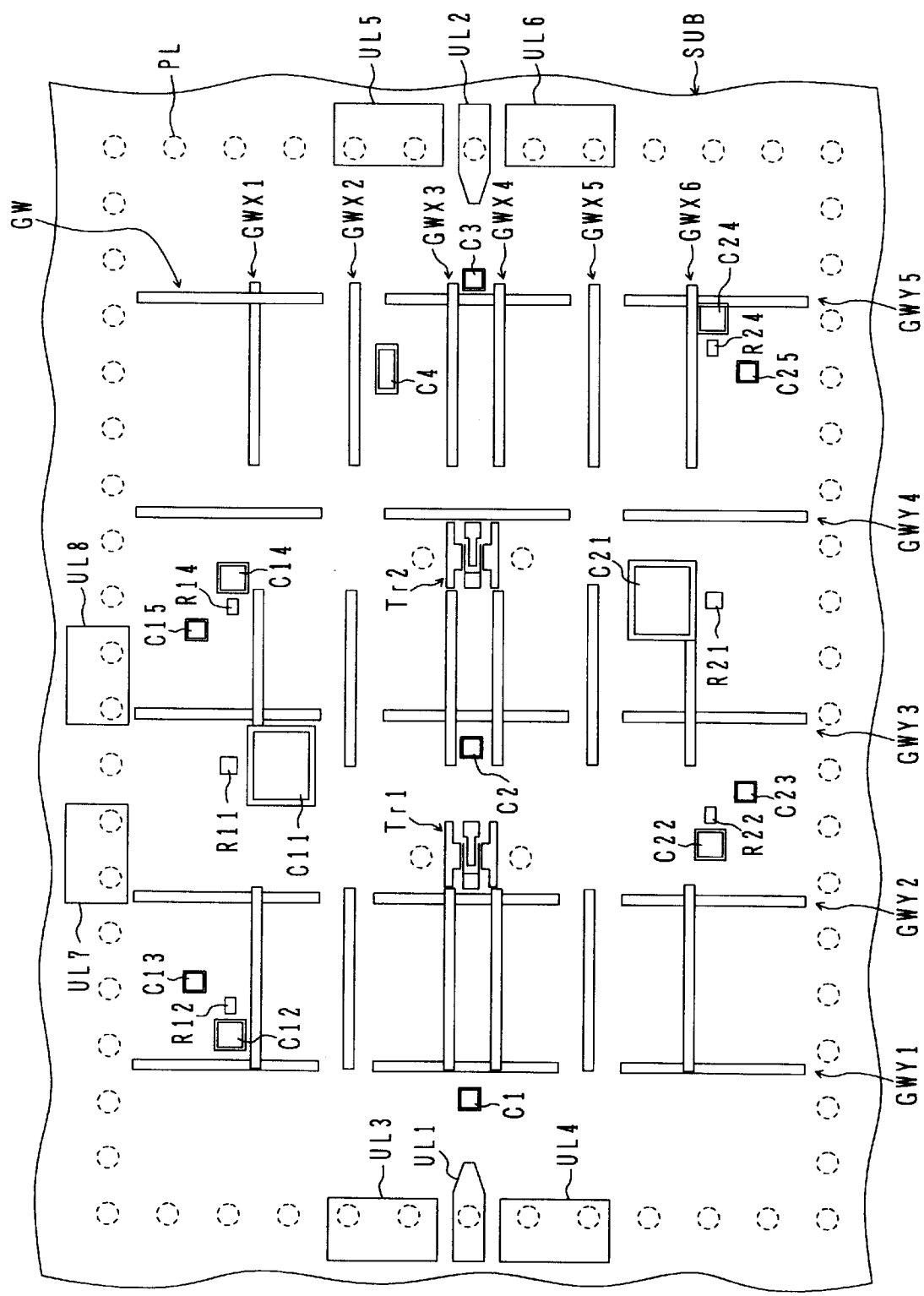
FIG. 2 is a diagram illustrating a plan view of the structure of a semiconductor substrate after bulk steps of a method for manufacturing the MMIC illustrated in FIG. 1.

FIG. 2 schematically illustrates in plan the structure of a dielectric substrate with a semiconductor region at the point the bulk steps of forming semiconductor elements, resistor elements, capacitors, etc. in the dielectric substrate have been finished.

The dielectric substrate SUB is formed in the following manner: an epitaxial layer is formed on a GaAs semiconductor substrate, for example, and oxygen ions are implanted in the redundant part of the semiconductor region of the substrate so that the redundant part becomes a semi-insulating dielectric region. The semiconductor elements, that is, transistors Tr and resistors R, are formed in the remaining semiconductor region, and capacitors C and the aforementioned ground conductor connecting wiring GW are formed on the dielectric region.

In the illustration, the reference character UL represents conductor patterns formed in the process of forming ohmic electrodes in contact areas provided for the transistors Tr and the resistors R. Circular patterns PL, shown by broken lines in the illustration, indicate the positions in which flip chip conductor pillars are arranged after the formation of a coplanar wiring.

According to the illustrated structure, the ground conductor connecting wiring GW includes X-directional ground conductor connecting wiring lines GWX extending horizontally in the illustration and Y-directional ground conductor connecting wiring lines GWY extending in the Y-direction. Six sets of X-directional ground conductor connecting wiring lines, GWX1 to GWX6, are arranged as the wiring lines GWX, while five sets of Y-directional ground conductor connecting wiring lines, GWY1 to GWY5, are arranged as the wiring lines GWY. The arrangement and number of wiring lines GWX and GWY can be variously changed according to necessity.

The characteristics of the circuit elements Tr, R and C illustrated in FIG. 2 may deviate from the design values. The deviation from the design values can not be discriminated until the coplanar wiring is formed on the dielectric substrate illustrated in FIG. 2 and the characteristics of the circuit elements are measured. When any design change is necessary, the coplanar wiring formed on the substrate surface is removed and a new coplanar wiring is formed. The lengths, arrangement, etc. of the ground conductor connecting wiring lines constituting the wiring GW are so selected that the wiring GW can be reused even if the arrangement, lengths, etc. of the lines are adjusted. Precautions against any parameter change are thus taken.

Of the deviation of the characteristics of the circuit elements, variations in the characteristics of the transistors Tr1 and Tr2 are particularly significant. The ground conductor connecting wiring is so selected that, when the S parameter of a circuit element is changed to a Y parameter, even if the converted Y parameter is varied by approximately 20%, for example, a line arrangement will be achievable which can compensate for the variation. For example, each ground conductor connecting wiring line is formed longer than required, and has extra parts at both ends thereof. Each of those extra parts is at least 10 $\mu$m long. The capacitor C4, connected to a line branching from the main signal wiring, is designed so that those sides of the capacitor C4 which are parallel to the main signal wiring are longer than those perpendicular to the main signal wiring, in order to permit the position of the line L7 to be changed along the X-direction.

The ground conductor patterns, separated from each other by the wiring, are mutually and electrically connected via the ground conductor connecting wiring GW. Between the ground conductor patterns separated from each other by the wiring, the ground conductor connecting wiring lines constituting the wiring GW are arranged at intervals of approximately ¼ or less of the wavelength of the high frequency signal transmitted through the main signal wiring.

In positions which are away from the centers of the branches of the lines by approximately ⅛ or less of the wavelength $\lambda$ of the signal transmitted through the main signal wiring, some ground conductor connecting wiring lines electrically connect the corresponding ground conductor patterns separated from each other by the lines, in consideration of that the potentials of the ground conductor patterns are unstable in the vicinity of the branches of the lines.

According to the structure illustrated in FIG. 2, X-directional ground conductor connecting wiring lines GWX3 and GWX4 are arranged on both sides of the main signal wiring so as to be spaced apart from the main signal wiring by a predetermined distance of $\lambda$/8 or less. The wiring lines GWX3 and GWX4 connect the corresponding ground conductor patterns separated from each other by the lines extending from the branches.

FIGS. 4A to 6C are schematic cross sectional views showing a process for manufacturing the MMIC illustrated in FIGS. 1 to 3. Those cross sectional views are ones taken along the broken lines X—X and Y—Y shown in FIG. 1. FIGS. 1 and 2 show such a structure as including a double-gate HEMT. For the sake of simplification, however, the HEMT will be explained as being a single-gate HEMT.

Figure 4A:
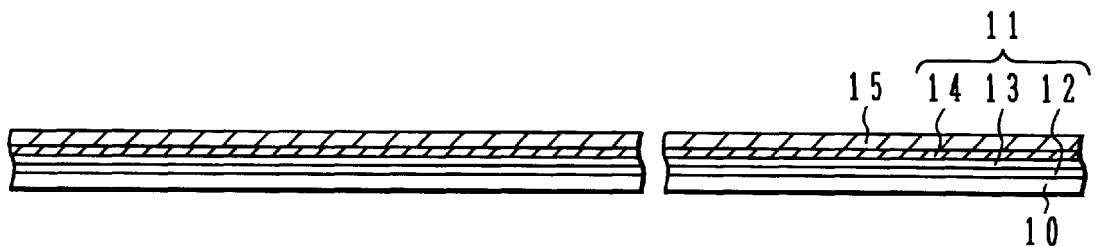
FIGS. 4A to 4D are schematic cross sectional views showing main steps of a method for manufacturing the MMIC according to another embodiment of the present invention.

As illustrated in FIG. 4A, an epitaxial layer 11 for forming a transistor is formed on a GaAs substrate 10, and a low resistance ne$^+$-type GaAs layer 15 is epitaxially grown on the layer 11. The epitaxial layer 11 for forming a transistor includes a non-doped GaAs buffer layer 12, a non-doped InGaAs electron transfer or channel layer 13 laminated on the layer 12, and an n-type InGaP electron supply layer 14 laminated on the layer 13.

In the case of forming an MESFET in place of the HEMT, the electron transfer layer 13 and the electron supply layer 14 are substituted for by a single channel layer which is, for example, an n-type GaAs layer.

Figure 4B:
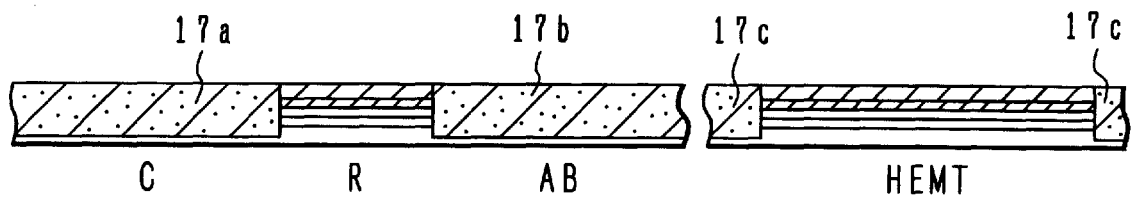

As illustrated in FIG. 4B, oxygen ions are selectively implanted from above so as to reach the GaAs substrate 10, thereby forming semi-insulating regions 17a, 17b and 17c. The semi-insulating region 17a is one on which a capacitor is to be formed. The semi-insulation region 17b is a wiring formation region where an air bridge is to be formed, at which the ground conductor connecting wiring and the main signal wiring cross one over the other. The semi-insulating region 17c is an HEMT isolation region.

Figure 4C:
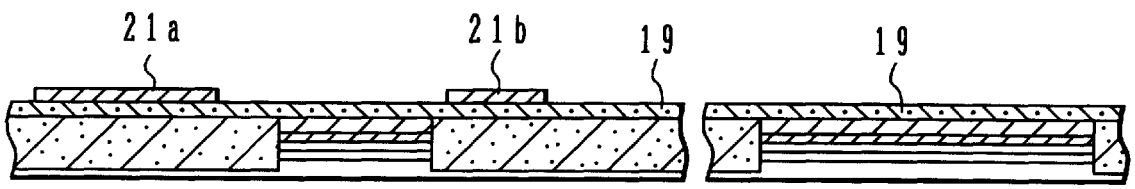

As illustrated in FIG. 4C, an SiON layer 19 is formed as an insulation layer over the entire substrate surface by CVD, for example. The SiON layer 19 ensures the insulation of a conductor layer which is provided thereon, and needs only have a thickness sufficient for attaining the insulation. The insulation layer 19 need not be formed if the insulation abilities of the semi-insulating regions 17 formed by the step shown in FIG. 4B are satisfactory.

After the formation of the insulation layer 19, an Au layer 21 (including 21a and 21b) having a thickness of approximately 1 $\mu$m, for example, is formed thereon. Resist patterns are formed on the Au layer 21, and milling is conducted to leave only Au layers 21a and 21b so as to have predetermined shapes. The resist patterns are removed thereafter. The Au layer can be formed by sputtering, for example. The Au layer 21a shown on the left side of the illustration forms the lower electrode of the capacitor, while the Au layer 21b shown on the right side of the illustration forms the ground conductor connecting wiring.

Figure 4D:
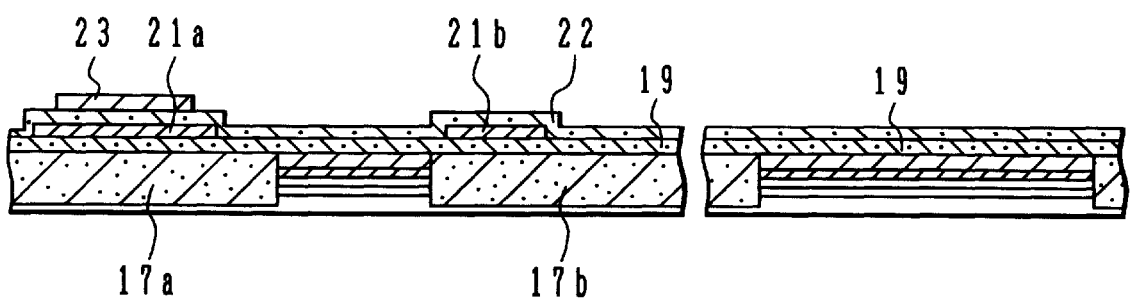

As illustrated in FIG. 4D, an silicon nitride film 22 is formed over the entire substrate surface as an insulation film. An Au layer 23 having a thickness of approximately 1 $\mu$m, for example, is formed thereon. A resist pattern is formed on the Au layer 23, and the unnecessary part of the Au layer 23 is removed by conducting milling, in which manner the upper electrode 23 of the capacitor is formed. The resist pattern is removed thereafter. Thus, the capacitor structure and the ground conductor connecting wiring are formed on the semi-insulating regions 17a and 17b. Furthermore, a resist pattern is formed to remove the redundant part of the silicon nitride layer 22 by etching.

Figure 5A:
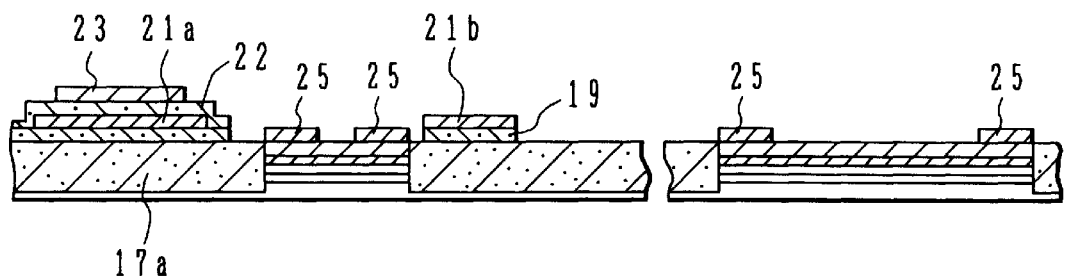
FIGS. 5A to 5C are schematic cross sectional views showing further main steps of the method for manufacturing the MMIC according to the above embodiment of the present invention.

As illustrated in FIG. 5A, the surface of a semiconductor region surrounded by the semi-insulating regions 17 is exposed, after which an alloy layer 25, made of AuGe and Ni and having a thickness of approximately 0.2 $\mu$m, is formed over the entire wafer surface by sputtering, vacuum deposition or the like. Resist patterns are formed on the alloy layer 25, and the alloy layer 25 is then subjected to patterning. Then, the resist patterns are removed, and a thermal treatment is conducted to form ohmic electrodes 25. One pair of ohmic electrodes 25, shown on the left side of the illustration, are used as terminals of a resistor element, while the other pair of ohmic electrodes 25, shown on the right side of the illustration, form the source electrode and drain electrode of the HEMT.

Figure 5B:
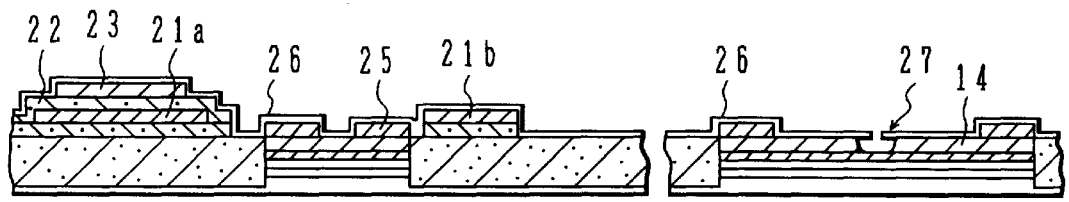

As illustrated in FIG. 5B, an SiON layer 26 is deposited over the entire wafer surface by CVD or the like. Then, a resist layer is formed on the SiON layer 26, an aperture is formed in correspondence with a region where the gate electrode of the HEMT is to be made, and the SiON layer 26 under the resist layer is anisotropically etched by dry etching or the like to form an aperture 27. After this, the $n^+$-type GaAs layer 14 under the SiON layer 26 is isotropically etched by dry etching, wet etching or the like through the aperture 27 as formed, in which manner a cavity larger than the aperture 27 of the SiON layer 26 is formed under the SiON layer 26 by side etching.

Figure 5C:
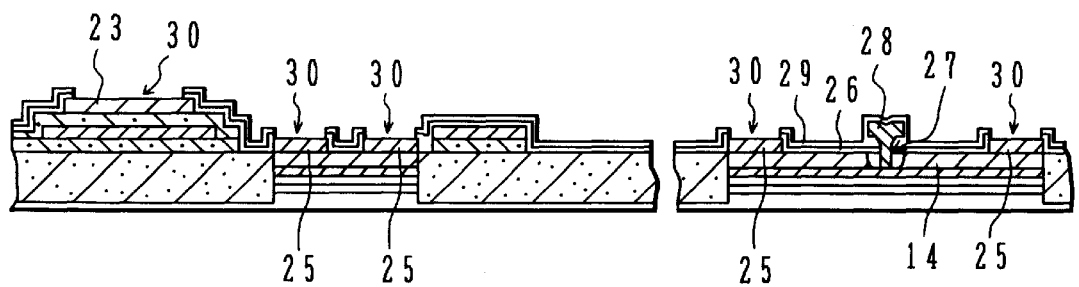

As illustrated in FIG. 5C, a metal layer 28 which is an Al layer, for example, and which is to form the Shottkey gate electrode of the HEMT, is deposited by vacuum deposition. The metal layer 28 is subjected to patterning using a resist mask, thereby forming the gate electrode 28 of the HEMT. The gate electrode 28 is separated by an air gap from the $n^+$-type GaAs layer 14.

Thereafter an SiN layer 29 is deposited over the entire substrate surface by light CVD or the like. A resist pattern is formed over the entire substrate surface, and openings 30 which extend vertically through the SiN layer 29 and the SiON layer 26 are formed by etching. In the openings 30, the ohmic electrodes 25 and the upper electrode 23 of the capacitor are exposed.

The bulk steps are finished by the above-described procedures. The semiconductor elements such as transistors and resistors, etc., and capacitors are formed by the bulk steps.

Figure 6A:
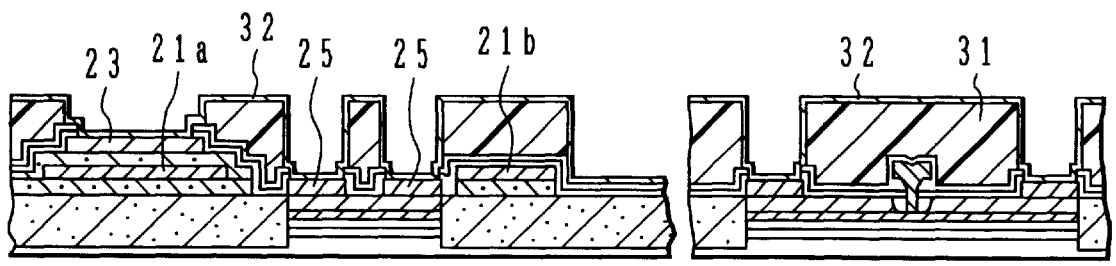
FIGS. 6A to 6C are schematic cross sectional views showing further main steps of the method for manufacturing the MMIC according to the above embodiment of the present invention.

As illustrated in FIG. 6A, a resist layer is formed over the entire wafer surface, and a resist pattern 31 is formed by conducting exposure and development. A positive resist, the product name of which is PMER PGE-900, for example, is used as the resist. The resist pattern 31 has openings in correspondence with the electrodes formed by the bulk steps.

After the formation of the resist pattern 31, a metal layer 32 which is made of AuTi alloy or the like is formed by vacuum deposition or the like as a seed layer for plating. The metal layer 32 is deposited over the entire wafer surface including the openings.

Figure 6B:
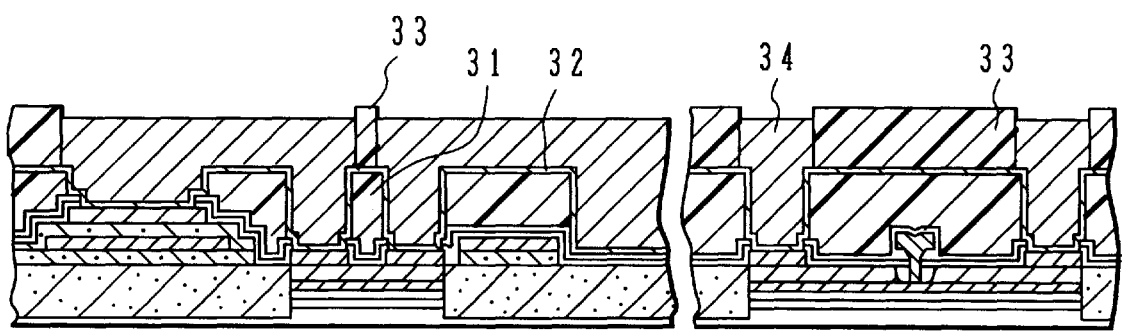

A resist layer 33 for the plating of a thicker metal layer is coated as illustrated in FIG. 6B, and is subjected to exposure and development in order to form thick resist patterns 33. This resist is a positive one whose product name is OFPR800LB. The thickness of the resist layer is set at a value large enough to plate the desired metal layer.

Then, electrolytic plating is conducted utilizing the seed layer 32 for plating. For example, an Au layer 34 having a thickness of approximately 6 μm is plated.

The Au layer 34 is illustrated as if it had a planar surface. However, the surface of the layer as plated by the actual plating process is uneven due to the unevenness of the underlying surface.

Figure 6C:
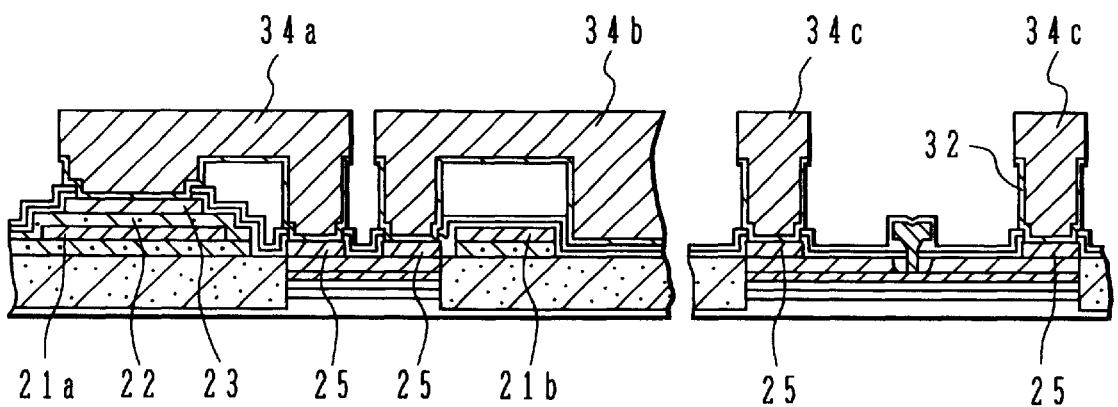

As illustrated in FIG. 6C, the resist layer 33 is removed using a remover agent. The metal layer 32 which has appeared from underneath is removed by milling. Furthermore, the exposed resist layer 31 is removed by using the remover agent. In this manner, the illustrated structure is attained.

A plated Au layer 34a, shown on the left side of the illustration, connects the upper electrode 23 of the capacitor and one ohmic electrode 25 of the resistor element by an air bridge. A plated Au layer 34b, shown in the central part of the illustration, is connected to the other ohmic electrode 25 of the resistor element. The Au layer 34b crosses over the ground conductor connecting wiring 21b and forms a wiring extending rightward in the illustration. A plated Au layer 34c, shown on the right side of the illustration, forms a wiring layer connected to the source/drain electrode 25 of the HEMT.

In the drawings illustrating cross sections for explaining the above-described process, the capacitor is illustrated with its structure being simplified. In actual configuration, however, the capacitor structure includes also a contact area for the lower electrode.

Figure 7A:
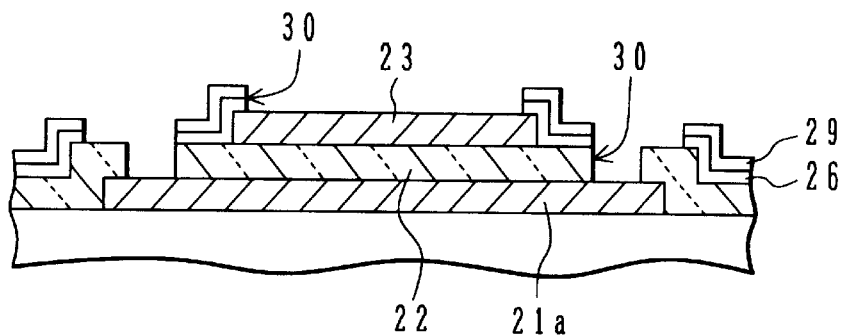
FIGS. 7A to 7C are enlarged cross sectional views of a part of the structure illustrated in FIGS. 4A to 6C and an enlarged plan view of a part of the MMIC illustrated in FIG. 1.

FIG. 7A schematically illustrates an example of the more specific structure of the capacitor. In FIG. 7A, a capacitor's dielectric layer 22 is formed on the capacitor's lower electrode 21a, and the capacitor's upper electrode 23 is formed on the capacitor's dielectric layer 22. A laminated insulation layer which consists of the SiON layer 26 and the SiN layer 29 is formed on the capacitor's upper electrode 23, and the openings 30 are formed penetrating through the laminated insulation layers.

The openings 30 include a region where the upper electrode is exposed, as well as a region where the lower electrode is exposed. A wiring layer is deposited on such a structure and is subjected to patterning, whereby a wiring line for the lower electrode and a wiring line for the upper electrode can be formed independently of each other.

Figure 7B:
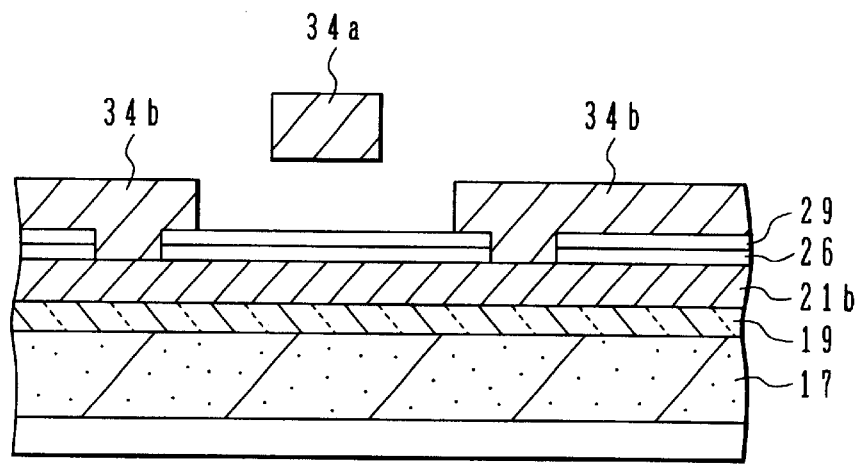

FIG. 7B schematically illustrates the structure of the section where the wiring crosses over the ground conductor connecting wiring. The SiON layer 19 is formed on the semi-insulating region 17 in which oxygen ions have been implanted, and the ground conductor connecting wiring 21b is formed in stripes on the SION layer 19. The laminated insulation layer consisting of the SION layer 26 and the SiN layer 29 is formed so as to cover the ground conductor connecting wiring 21b formed in stripe pattern. A thick layer is plated on the laminated insulation layer as a coplanar wiring 34.

The openings are formed in the main parts of the laminated insulation layer consisting of the layers 26 and 29. The ground conductor connecting wiring 21b connects ground conductor layers 34b which face each other with a wiring line 34a sandwiched in between. In the case of changing the position of the wiring line 34a, the coplanar wiring lines 34a and 34b are once removed and thereafter the coplanar wiring lines are newly formed in positions different from those previously formed. In the case where a new contact hole for the ground conductor connecting wiring is necessary, such a contact hole is formed by a photolithographic process.

Thus, according to the above-described structure, the coplanar wiring lines can be formed in positions different from those previously formed, with the ground conductor connecting wiring 21b being left as it is.

Figure 7C:
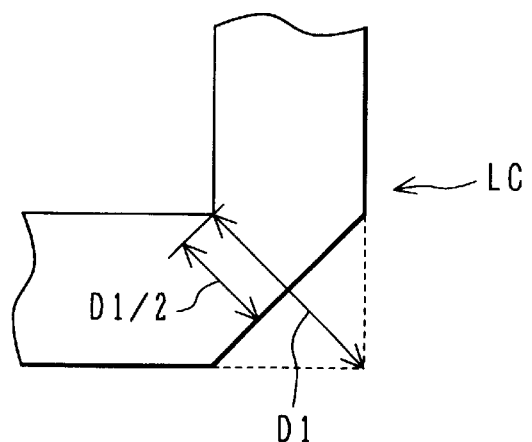

FIG. 7C is a plan view of a curve LC in the wiring. According to the structure illustrated in FIG. 1, the open stub OS1 has a curve LC. In the case of bending a high frequency signal wiring line at right angles, reflection occurs when the outer side of the wiring line is also bent at a right angle as shown by a broken line. According to a report, reflection can be prevented logically when the corner of the wiring line is cut by ⅙ of the length D1 of the diagonal. The inventor of the present invention has, however, discovered through experiments that reflection could not be prevented when the corner was cut by ⅙ of the length D1, but could be effectively prevented when it was cut by approximately ½ of the length D1 at an angle of 45 degrees.

FIG. 8 schematically illustrates, in perspective, the relationship between a circuit element formed by the bulk steps, and a coplanar wiring formed thereon and whose position can be changed.

A capacitor C is formed on the left side of the illustration, and a resistor R is formed adjacent to the capacitor C. The capacitor C and the resistor R are connected to each other via one air bridge wiring line L. A ground conductor connecting wiring line GW extending laterally, and another wiring line L in the form of an air bridge crossing over the ground conductor connecting wiring line GW, are shown in the central part of the illustration. This wiring line L is connected to the current terminal of a transistor Tr such as an HEMT.

The gate electrode of the transistor Tr, which extends diagonally in a rightward, upward direction, is connected to another wiring line L. This wiring line L crosses over another ground conductor connecting wiring line GW as an air bridge. In the illustration, the ground conductor connecting wiring lines GW extend long in the horizontal direction, and can be utilized as they are even if the lines L are horizontally displaced to other positions.

After the coplanar wiring has been formed as illustrated in FIG. 6C, a thick resist pattern is formed again above the substrate surface, and flip chip bonding pillars like those illustrated in FIG. 1 are formed by plating. FIG. 8 illustrates such pillars PL as well.

In FIG. 1, signal terminals P1 an P2 are provided with a signal input pillar PLI and a signal output pillar PLO, respectively, while bias voltage applying terminals P3 and P4 are provided with bias voltage applying pillars PLG and PLD, respectively. A plurality of ground pillars PLG are formed along the periphery of each of the ground conductor patterns GP1, GP2, GP5 and GP6. The ground conductor patterns GP3 and GP4, shown in the central part of the illustration, are connected to their neighboring ground conductor patterns via the ground conductor connecting wiring.

In order to ensure stable operations of the transistors Tr1 and Tr2 which are active elements, it is preferred that pillars be arranged on those of the ground conductor patterns which are located on both sides of each of the above transistors. According to the illustrated structure, pillars PL1 and PL2 are formed on both sides of the transistor Tr1, while pillars PL3 and PL4 are formed on both sides of the transistor Tr2. Each pillar PL has an a diameter approximately between 40 $\mu$m and 80 $\mu$m, and has a height of 20 $\mu$m or greater. When the flip chip bonding strength is taken into consideration, the pillar's height is preferred to be 1 millimeter or less, or more desirably, 500 $\mu$m or less.

It is preferred that the pillars PL1 and PL2 on both sides of the transistor Tr1 and the pillars PL3 and PL4 on both sides of the transistor Tr2 be located each in an area of 100 $\mu$m to 200 $\mu$m from the center of its corresponding transistor. If the pillars PL are too close to their corresponding active elements, the electromagnetic coupling of the active elements and the pillars will be so intense that the performances of the active elements will be degraded. If the pillars are too far away from their corresponding active elements, it will be difficult to satisfactorily stabilize the potentials of the ground conductor patterns around the active elements. It is preferred that each of the pillars around the active elements be arranged approximately 125 $\mu$m away from its corresponding active element.

The pillars along the periphery of the chip are preferably arranged at nearly equal intervals. There is a case where an adhesive is coated on the periphery in order to increase the flip chip bonding strength. In such a case, the adhesive can be prevented from entering the central part of the chip if the interval between adjacent pillars is uniform and appropriate.

The pillars on the pads serving as current/voltage terminals are formed so that a distance between 35 $\mu$m and 45 $\mu$m is left between each pillar and the outer end of its corresponding pad. In other words, the outer end portion of each of the above-mentioned pads has a pillar-less probe contact area whose length is between 35 $\mu$m and 45 $\mu$m. The characteristics of the MMIC can be tested by bringing a probe into contact with the probe contact area. The characteristics of the MMIC can be measured using a high frequency probe "pico-probe model 120" produced by GGB company, for example.

The pads P1 and P2, through which a high frequency signal passes, have the same width as the main signal wiring at their ends proximate to the main signal wiring, and the width of the pads P1 and P2 increases toward the pillars. In the regions where the pillars are present, the pads P1 and P2 are wider than the pillars PLI and PLO.

Gradually increasing the width of the bias voltage applying pads P3 and P4 is not required since those pads do not need to supply a high frequency signal. The above pads need only be rectangular and connected to the wiring, as shown in the illustration. However, the width of those pads can be gradually increased as well.

In the case where the MMIC as manufactured is detected to be defective as a result of the test performed by using a probe, the cause of the defect is investigated and any design change is made to the wiring. The coplanar wiring as formed is removed by milling, etching or the like, and a redesigned new coplanar wiring is formed.

Figure 9A:
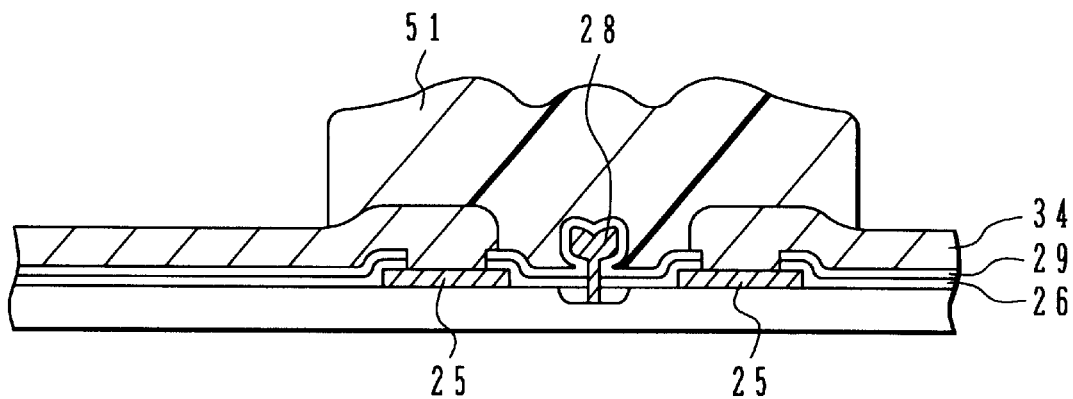
FIGS. 9A to 9C are a cross sectional view schematically illustrating a rewiring step according to the above embodiment of the present invention.

As illustrated in FIG. 9A, a resist pattern 51 is formed on part, such as semiconductor active elements, which are susceptible to the influence of milling.

Figure 9B:
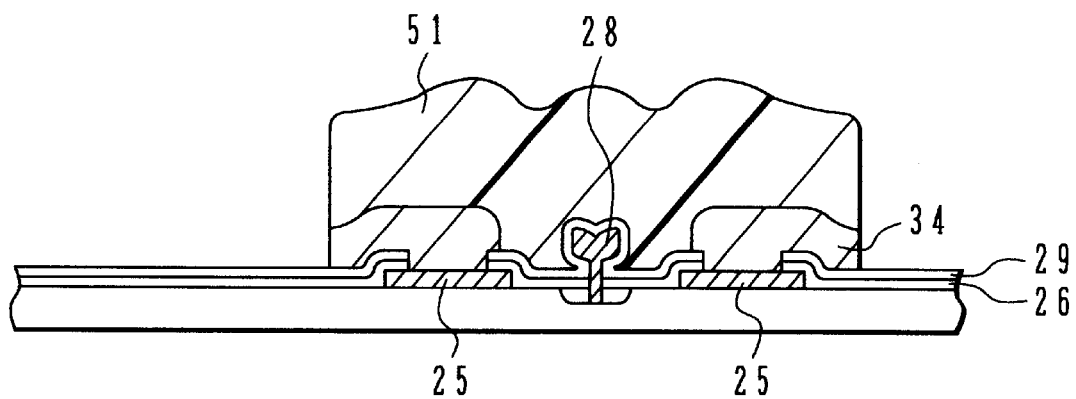

As illustrated in FIG. 9B, using the resist pattern 51 as a milling mask, exposed parts of the coplanar wiring 34 are removed by effecting milling through utilization of argon ions or the like. Those parts of the coplanar wiring 34 which are covered by the resist pattern 51 remain unremoved. The resist on pattern 51 is removed afterwards.

Figure 9C:
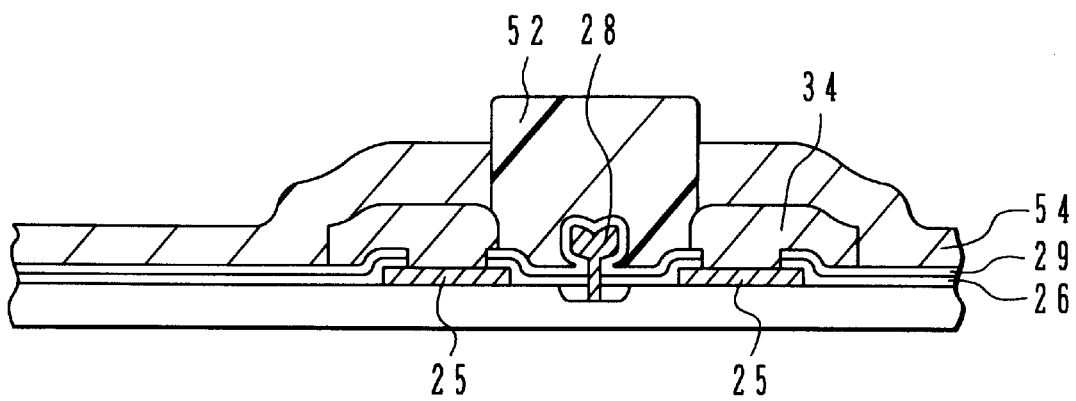

As illustrated in FIG. 9C, a new resist pattern 52 is formed above the substrate. This resist pattern has a shape determined by that of the redesigned wiring. A new wiring 54 is formed above those parts of the substrate which are not covered by the resist pattern 52. The redesigned coplanar wiring is formed in this manner. In the regions where parts of the previously formed wiring 34 remain unremoved, the thickness of the entire wiring layer is approximately two times as large as that in the region which includes only the new wiring.

There may be a case where also the thickness of the wiring layer is changed. Even in such a case, however, the total thickness of the stacked wiring layer, including both the previously formed wiring and the new wiring, is at least approximately 1.5 times as large as that in the region which includes only the new wiring.

Measurements were performed to determine the degree to which the characteristics of the high frequency circuit were improved due to the ground conductor connecting wiring of the above-described embodiment.

Figure 10A:
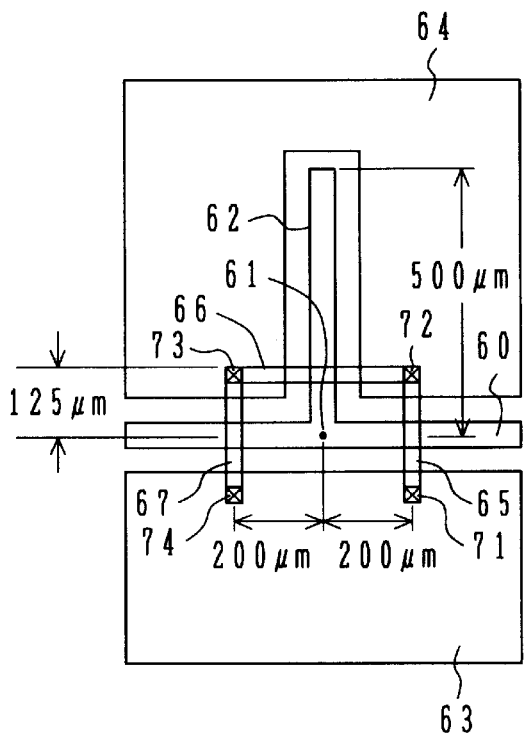
FIGS. 10A and 10B are a schematic plan view and a graph for explaining experiments to prove the advantage of the above embodiment of the present invention.

FIG. 10A schematically illustrates the shape of a sample. A wiring line 60 was laid straight, and an open stub 62 was formed branching almost perpendicularly from an intermediate point 61 on the wiring line 60. Two ground conductor patterns 63 and 64 were formed around the wiring lines 60 and 62, with a predetermined gap in between.

Ground conductor connecting wiring lines 65, 66 and 67 were buried below the aforementioned wiring lines and the ground conductor patterns so as to underpass the wiring lines 60 and 62, and were connected at contacts 71, 72, 73 and 74 to the ground conductors 63 and 64 arranged above the wiring lines 65, 66 and 67. The distance between the point 61 and each of the ground conductor connecting wiring lines 65 and 67 was approximately 200 $\mu$m, while the distance between the point 61 and the ground conductor connecting wiring line 66 was approximately 125 $\mu$m. The end of the open stub was 500 $\mu$m away from the point 61.

Figure 10B:
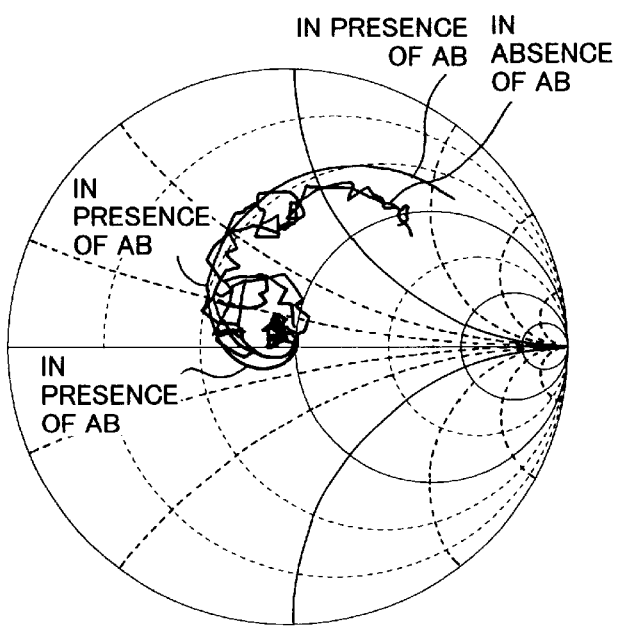
Figure 10C:
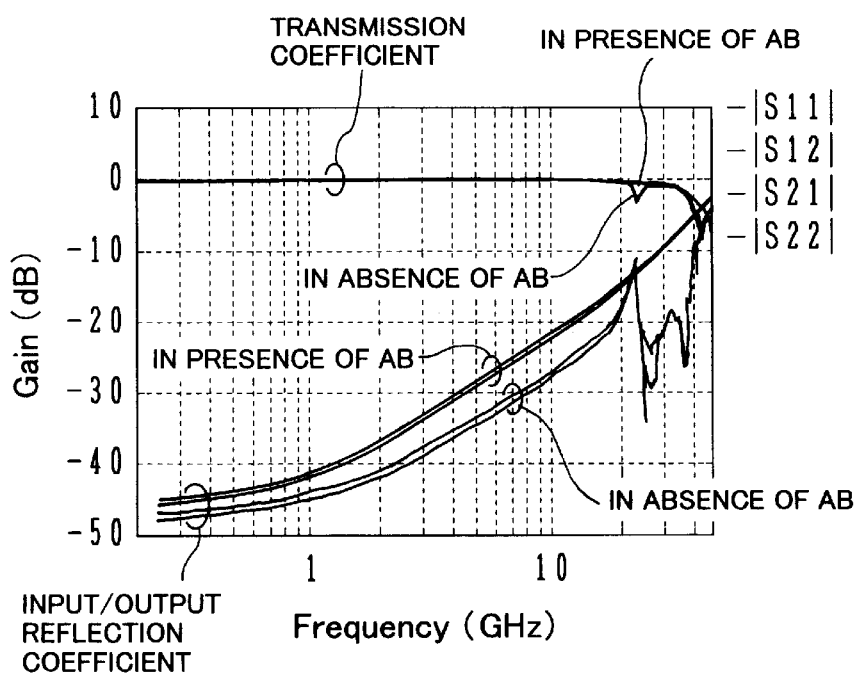

FIG. 10B is a graph showing a comparison between the case where a ground conductor connecting air bridge wiring AB was present and the case where the ground conductor connecting wiring AB was absent. FIG. 10C is a graph showing the input/output reflection coefficient and the transmission coefficient in dB.

As seen from those graphs, when adjacent ground conductors are electrically connected to each other via the ground conductor connecting wiring lines 65, 66 and 67, the input/output reflection coefficient describes a more ideal curve.

Furthermore, an investigation was made on what width a ground conductor pattern was preferred to have. A striped ground conductor pattern was arranged so that its stripes were located with one on either side of a wiring line having a width of 20 $\mu$m. Each of the stripes was separated from the wiring line by 20 $\mu$m. The characteristic impedance was measured varying the width of the stripes.

TABLE 1

| Width of ground conductor stripes ($\mu$m) | Characteristic impedance $Z_o$ ($\Omega$) |
| --- | --- |
| 10 | 64.7 |
| 20 | 60.5 |
| 30 | 58.8 |
| 40 | 57.9 |
| 50 | 57.3 |
| 60 | 57.0 |
| 70 | 56.7 |
| 80 | 56.5 |
| 90 | 56.4 |
| 100 | 56.3 |
| 110 | 56.2 |

As seen from Table 1, the characteristic impedance had a value approximate to the ideal value when the width of the ground conductor pattern was at least approximately six times as large as that of the wiring width.

The shape of the ground conductor connecting wiring can be changed in various ways.

Figure 11:
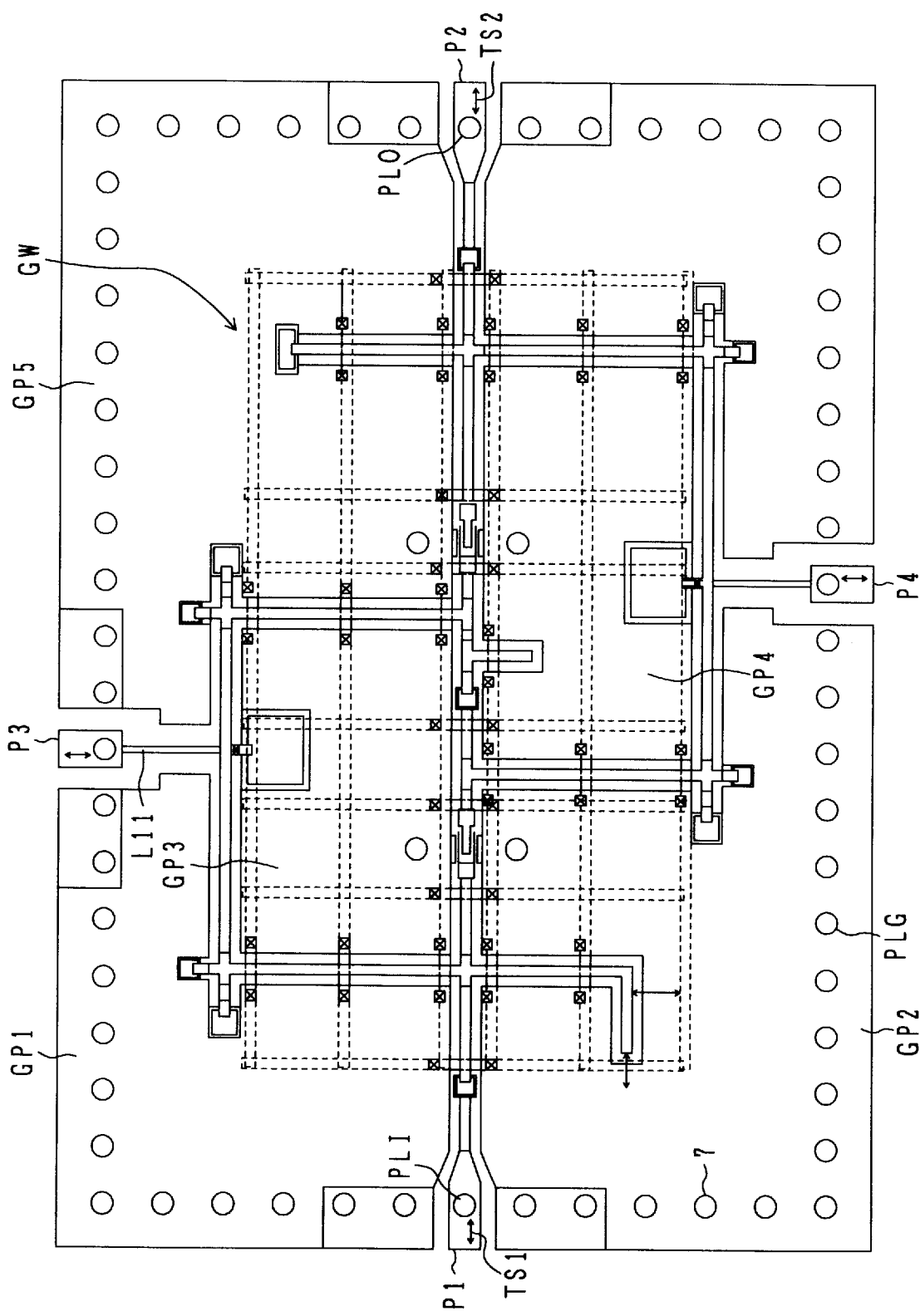
FIG. 11 is a diagram schematically illustrating a plan view of the structure of an MMIC according to another embodiment of the present invention.

FIG. 11 schematically illustrates in plan a structure employing a ground conductor connecting wiring consisting of lines arranged in cross stripes or lattice. The circuitry of the MMIC as formed is identical to that illustrated in FIG. 1. The ground conductor connecting wiring GW includes stripes extending in the X-direction and stripes extending in the Y-direction. The stripes extending in the X-direction and the stripes extending in the Y-direction constitute a cross stripe arrangement. Those parts of the ground conductor connecting wiring which overlap each other are formed of a single metal layer. Moreover, in regard to that part of the ground conductor connecting wiring which overlaps the lower electrode (or the upper electrode) of a capacitor, the aforementioned overlapping part and the lower electrode (or the upper electrode) may be formed from the same metal layer.

The above explanations have been made exemplifying a two-stage amplifier. However the type of the MMIC is not limited to a two-stage amplifier.

Figure 12:
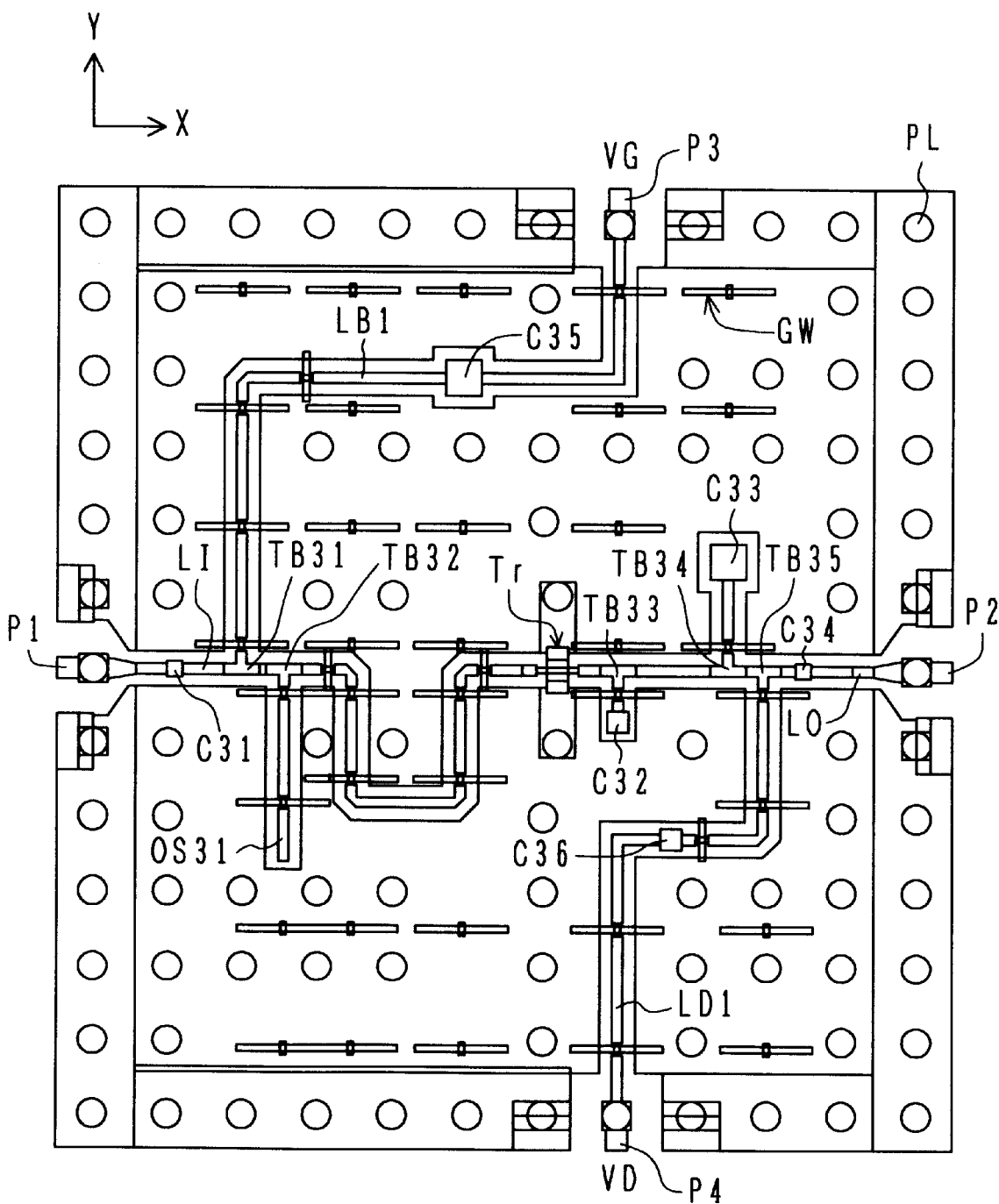
FIG. 12 is a diagram schematically illustrating a plan view of the structure of an MMIC according to another embodiment of the present invention.

FIG. 12 schematically shows the structure of an MMIC serving as a frequency multiplier. An input line LI, connected to the input pad P1, has a capacitor C31 and T-shaped branches TB31 and TB32 provided in the middle part of the input line LI. The input line LI is connected to the gate terminal of a transistor Tr which is constituted by a HEMT serving as a semiconductor active element. The drain terminal of the transistor Tr is connected to the output pad P2 via an output line LO. T-shaped branches TB33 and TB34 and a capacitor C34 are connected to the output line LO.

The gate bias applying pad P3 is connected to a T-shaped branch TB31 via a gate bias line LB1. A capacitor C35 is connected to the middle part of the gate bias line LB1. The drain bias applying pad P4 is connected to a T-shaped branch TB35 via a drain bias line LD1. A capacitor C36 is connected to the middle part of the drain bias line LD1. According to the structures described above, the capacitors C31, C34, C35 and C36 all cut off DC components.

An open stub OS31 is connected to the T-shaped branch TB32. A capacitor C32 is connected to the T-shaped branch TB33 via a line, while a capacitor C33 is connected to the T-shaped branch TB34 via a line. Those structures are employed to adjust the reflection coefficient, etc. and achieve a specific-frequency short circuit on the input and output sides of the transistor Tr.

The transistor Tr performs the frequency conversion of an input high frequency signal, utilizing its own nonlinear characteristic. For example, a 38 GHz signal is input to the input pad P1, and a 76 GHz signal is output to the output pad P2.

The ground conductor connecting wiring GW includes a large number of striped lines extending in the horizontal (X) direction and stripe lines extending in the vertical (Y) direction which are arranged in the required parts only. According to this structure, the high frequency characteristic of the circuit is adjusted by changing the horizontal positions of the T-shaped branches TB arranged in the main signal wiring.

Figure 13:
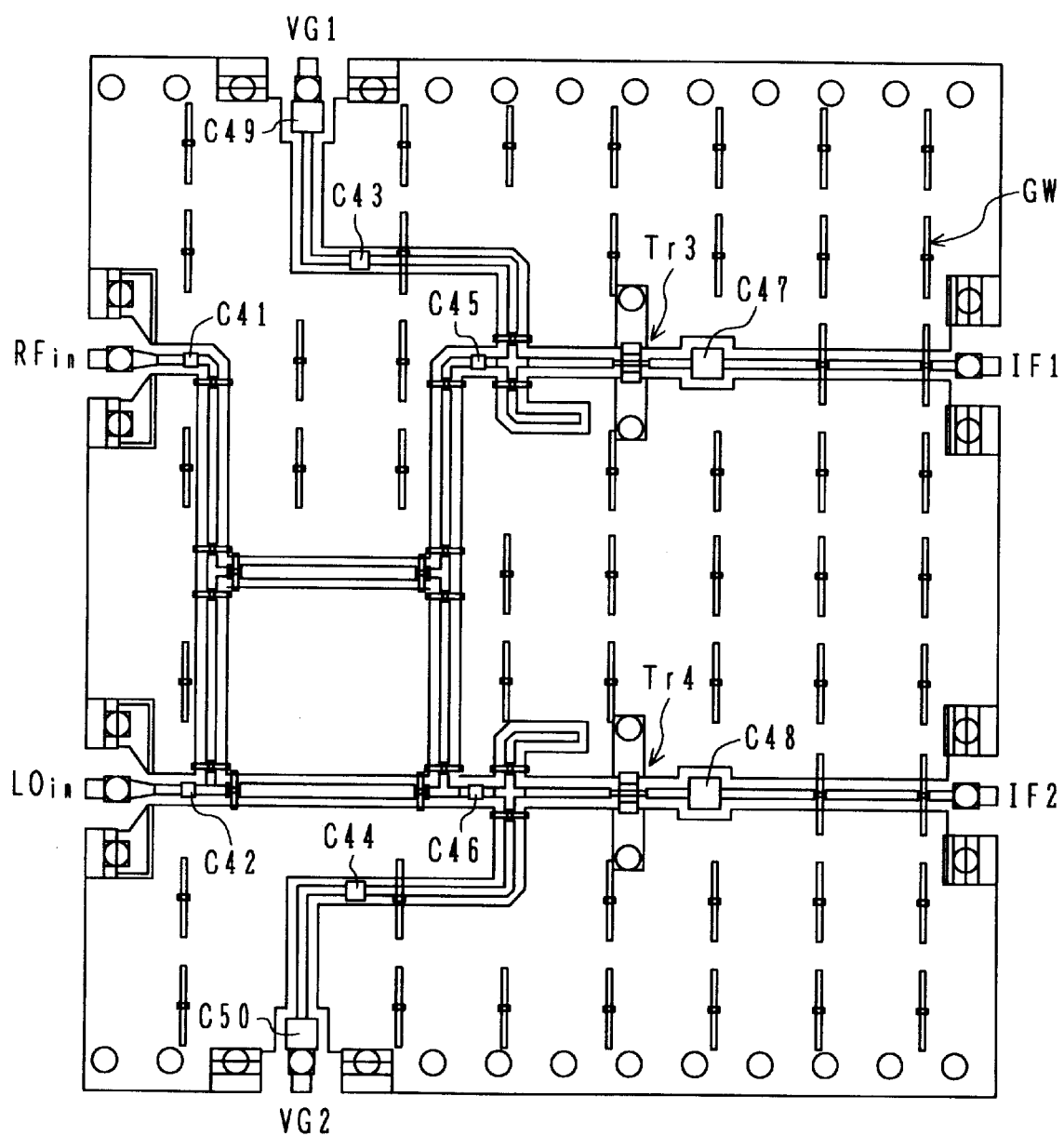
FIG. 13 is a diagram schematically illustrating a plan view of the structure of an MMIC according to another embodiment of the present invention.

FIG. 13 schematically illustrates the structure of an MMIC which serves as a mixer. A pad RFin, shown on the right side of the illustration, is an input pad to which a high frequency signal is supplied. A pad LOin is a pad to which a local oscillation signal is input. For example, a 76 GHz signal is input to the pad RFin, and a 76.01 GHz signal is input to the pad LOin. Those two input signals are combined into one signal, which is supplied to two transistors Tr3 and Tr4. The outputs from the transistors Tr3 and Tr4 are supplied to output pads IF1 and IF2 through capacitors C47 and C48.

Bias voltages to be applied to the gate electrodes of the transistors Tr3 and Tr4 are applied to gate bias pads VG1 and VG2, respectively. Reference characters C41 to C50 represent capacitors for cutting off DC components. 10 MHz signals of opposite phases are output to the output pads IF1 and IF2.

In this embodiment, the ground conductor connecting wiring GW includes a large number of striped lines extending vertically and stripe lines extending horizontally which are arranged in the required parts only.

Embodiments of the present invention have been explained above. However, the present invention is not limited to them. For example, a dielectric substrate can be used in place of the semiconductor substrate. The circuit elements, such as resistors, etc., and the ground conductor connecting wiring may be formed on the surface of the substrate, and coplanar wiring may be formed on the circuit elements and the ground conductor connecting wiring.

Various modifications, improvements and combinations are available, as should be apparent to a person skilled in the art.

What is claimed is:

1. A microwave-millimeter wave circuit device comprising:

a dielectric substrate having a dielectric region;

a ground conductor connecting wiring and circuit elements formed on said dielectric substrate;

a wiring electrically connected to said circuit elements and crossing over a part of said ground conductor connecting wiring on said dielectric substrate; and ground conductor patterns separated from each other by said wiring, being electrically connected to each other via a part of said ground conductor connecting wiring, and forming a coplanar wiring on said dielectric substrate, together with said wiring;

wherein at least one end of said part via which said ground conductor patterns are electrically connected to each other is provided with an extended portion which is at least 10 $\mu$m long, in order to permit said coplanar wiring to be redesigned in compensation for variations in characteristics of said circuit elements.

2. The microwave-millimeter wave circuit device according to claim 1, wherein said extended portion has a wider area than said part via which said ground conductor patterns are connected to each other.

3. The microwave-millimeter wave circuit device according to claim 1, wherein said ground conductor connecting wiring is formed in cross stripes or in form of an arrangement of lines extending on said dielectric substrate along at least two directions.

4. The microwave-millimeter wave circuit device according to claim 1, wherein:

said wiring includes a main signal wiring for transmitting a high frequency signal from an input to an output, and a sub wiring connected to said main signal wiring; and said ground conductor connecting wiring has parts each of which mutually and electrically connects adjacent ones of said ground conductor patterns separated from each other by said wiring, and which are arranged at intervals of approximately ¼ or less of a wavelength of the high frequency signal which passes through said main signal wiring.

5. The microwave-millimeter wave circuit device according to claim 1, wherein:

said dielectric substrate has a semiconductor region; and said circuit elements includes at least one semiconductor element formed in said semiconductor region and at least one capacitor element formed on said dielectric region.

6. The microwave-millimeter wave circuit device according to claim 5, wherein said wiring includes a main signal wiring for transmitting a high frequency signal from an input to an output, and a sub wiring connected to said main signal wiring and crossing over a part of said ground conductor connecting wiring.

7. The microwave-millimeter wave circuit device according to claim 6, wherein said ground conductor connecting wiring has parts each of which mutually and electrically connects adjacent ones of said ground conductor patterns separated from each other by said wiring, and which are arranged at intervals of approximately ¼ or less of a wavelength of a high frequency signal which passes through said main signal wiring.

8. The microwave-millimeter wave circuit device according to claim 7, wherein:

said circuit device further comprises an input pad and an output pad which are arranged in opposing positions on said dielectric substrate;

at least one of said input pad, said output pad, said at least one semiconductor element and said at least one capacitor element is electrically connected to said main signal wiring; and said ground conductor connecting wiring has parts arranged along said main signal wiring and spaced a predetermined distance away from said main signal wiring.

9. The microwave-millimeter wave circuit device according to claim 7, wherein:

said wiring has branches to which said main signal wiring and said sub wiring are connected; and said ground conductor connecting wiring has portions each electrically connecting, in a position which is away from a corresponding one of said branches by a distance of approximately ⅛ or less of said wavelength, a pair of ground conductor patterns separated from each other by said wiring.

10. The microwave-millimeter wave circuit device according to claim 9, wherein said sub wiring crosses over said portions of said ground conductor connecting wiring.

11. The microwave-millimeter wave circuit device according to claim 7, wherein:

said sub wiring includes bias applying wiring lines for applying a bias voltage to said main signal wiring, and an adjusting wiring line for adjusting a high frequency characteristic of said main signal wiring; and one side of said at least one capacitor element is connected to said adjusting wiring, and is longer than another side of said at least one capacitor element which is parallel to said adjusting wiring.

12. The microwave-millimeter wave circuit device according to claim 7, wherein:

said sub wiring includes bias applying wiring lines for applying a bias voltage to said main signal wiring, and adjusting wiring lines for adjusting a high frequency characteristic of said main signal wiring; and at least one of said adjusting wiring lines has a curve portion curving substantially at a right angle and corresponding in shape to a remainder when a corner, which two wiring lines will form if met substantially at a right angle, is cut by approximately ½ of a length of a diagonal, and said curve portion has an outer side which defines an angle of 45 degrees with each of sides of said wiring which are substantially perpendicular to each other.

13. The microwave-millimeter wave circuit device according to claim 5, wherein said at least one semiconductor element has an ohmic electrode, and said at least one capacitor has a lower electrode and an upper electrode formed with a dielectric insulation film in between.

14. The microwave-millimeter wave circuit device according to claim 13, wherein said ground conductor connecting wiring includes a conductor layer, and said conductor layer and at least one of the upper and lower electrodes of said at least one capacitor are formed from a single layer.

15. The microwave-millimeter wave circuit device according to claim 5, further comprising:

a plurality of pads, formed on a periphery of said dielectric substrate, being made of conductive material, and being connected to said wiring; and first pillars arranged one on each of said plurality of pads and being made of conductive material.

16. The microwave-millimeter wave circuit device according to claim 15, wherein each of said plurality of pads has a probe contact area for a contact with a probe and which is located outward from a corresponding one of said first pillars, and said probe contact area has a length between 35 μm and 45 μm.

17. The microwave-millimeter wave circuit device according to claim 15, wherein of said plurality of pads, pads through which a high frequency signal passes have the same width as said wiring at ends connected to said wiring, and said width gradually increases outwardly.

18. The microwave-millimeter wave circuit device according to claim 15, wherein said first pillars have a diameter of 40 μm to 80 μm and a height of not less than 20 μm.

19. The microwave-millimeter wave circuit device according to claim 15, further comprising second pillars which are arranged on said ground conductor patterns, which are spaced a distance of 100 μm to 200 μm away from a center of said at least one semiconductor element, and which are made of conductive material.

20. A microwave-millimeter wave circuit device comprising:

a dielectric substrate having a semiconductor region and a dielectric region;

a semiconductor element formed in said semiconductor region;

a ground conductor connecting wiring and a capacitor element which have been formed on said dielectric region;

a wiring electrically connected to said semiconductor element and said capacitor element and crossing over a part of said ground conductor connecting wiring on said dielectric substrate; and ground conductor patterns separated from each other by said wiring, being electrically connected to each other via a part of said ground conductor connecting wiring, and forming a coplanar wiring on said dielectric substrate, together with said wiring;

wherein a part of said wiring, connected to said semiconductor element, has a thickness which is at least 1.5 times as large as a mean thickness of said wiring.

* * * * *